(12) United States Patent
Gopalakrishnan et al.

(10) Patent No.: US 7,829,926 B2
(45) Date of Patent: *Nov. 9, 2010

(54) DEMULTIPLEXERS USING TRANSISTORS FOR ACCESSING MEMORY CELL ARRAYS

(75) Inventors: Kailash Gopalakrishnan, San Jose, CA (US); Rohit Sudhir Shenoy, Fremont, CA (US)

(73) Assignee: International Business Machines Corporation, Armonk, NY (US)

( * ) Notice: Subject to any disclaimer, the term of this patent is extended or adjusted under 35 U.S.C. 154(b) by 49 days.

This patent is subject to a terminal disclaimer.

(21) Appl. No.: 12/114,857

(22) Filed: May 5, 2008

(65) Prior Publication Data

US 2008/0203438 A1    Aug. 28, 2008

Related U.S. Application Data

(63) Continuation of application No. 11/468,512, filed on Aug. 30, 2006, now Pat. No. 7,393,739.

(51) Int. Cl.
*H01L 27/108* (2006.01)

(52) U.S. Cl. .................. 257/296; 257/204; 257/274

(58) Field of Classification Search ............ 257/204, 257/296, 274, 338
See application file for complete search history.

(56) References Cited

U.S. PATENT DOCUMENTS

| | | | |
|---|---|---|---|
| 5,933,366 A * | 8/1999 | Yoshikawa | 365/185.03 |
| 6,256,767 B1 | 7/2001 | Kuekes et al. | |
| 6,385,075 B1 | 5/2002 | Taussig et al. | |
| 6,478,231 B1 | 11/2002 | Taussig | |
| 6,854,092 B2 | 2/2005 | Hogg | |
| 7,075,844 B2 * | 7/2006 | Pagliato et al. | 365/207 |
| 7,554,861 B2 * | 6/2009 | Vimercati et al. | 365/189.07 |
| 7,562,269 B2 * | 7/2009 | Yoshida et al. | 714/719 |
| 2004/0113139 A1 | 6/2004 | DeHon et al. | |
| 2005/0006671 A1 | 1/2005 | Heath et al. | |
| 2005/0055387 A1 | 3/2005 | Kuekes et al. | |
| 2005/0193356 A1 | 9/2005 | Kuekes et al. | |
| 2006/0214683 A1 | 9/2006 | DeHon | |
| 2007/0130488 A1 | 6/2007 | Nakashima et al. | |
| 2008/0013378 A1 | 1/2008 | Crippa et al. | |

OTHER PUBLICATIONS

Hogg et al.; Assembling Nanoscale Circuits with Randomized Connections; Sep. 8, 2005; 20 pages.
Snider et al.; Crossbar Demultiplexers for Nanoelectronics Based on n-Hot Codes; IEEE Transactions on Nanotechnology, vol. 4, No. 2; Mar. 2005; 1536-125X; pp. 249-254.

(Continued)

*Primary Examiner*—Thao P. Le
(74) *Attorney, Agent, or Firm*—Schmeiser, Olsen & Watts

(57) ABSTRACT

A demultiplexer using transistors for accessing memory cell arrays. The demultiplexer includes (a) a substrate; (b) $2^N$ semiconductor regions which are parallel to one another and run in a first direction; (c) first N gate electrode lines, which (i) run in a second direction which is perpendicular to the first direction, (ii) are electrically insulated from the $2^N$ semiconductor regions, and (iii) are disposed between the first plurality of memory cells and the contact region; (d) a contact region; (e) a first plurality of memory cells. An intersection transistor exists at each of intersections between the first N gate electrode lines and the $2^N$ semiconductor regions. In response to pre-specified voltage potentials being applied to the contact region and the first N gate electrode lines, memory cells of the first plurality of memory cells disposed on only one of the $2^N$ semiconductor regions are selected.

36 Claims, 11 Drawing Sheets

OTHER PUBLICATIONS

Zhong et al.; Nanowire Crossbar Arrays as Address Decoders for Integrated Nanosystems; www.sciencemag.org; Science, vol. 302; Nov. 2003; pp. 1377-1379.

Strukov et al.; CMOL FPGA: a reconfigurable architecture for hybrid digital circuits with two-terminal nanodevices; Institute of Physics Publishing; Nanotechnology 16 (2005); doi:10.1088/0957-4484/16/6/045; pp. 888-900.

Beckman et al.; Bridging Dimensions: Demultiplexing Ultrahigh-Density Nanowire Circuits; www.sciencemag.org; Science, vol. 310, Oct. 21, 2005; pp. 465-468.

Ma et al.; Afterlife for Silicon: CMOL Circuits Architectures; Email: klikharev@notes.cc.sunysb.edu; 4 pages.

Dehon et al.; Nonphotolithographic Nanoscale Memory Density Prospects; IEEE Transactions on Nanotechnology, vol. 4, No. 2; Mar. 2005; pp. 215-228.

* cited by examiner

DEMULTIPLEXERS USING TRANSISTORS FOR ACCESSING MEMORY CELL ARRAYS

This application is a continuation application claiming priority to Ser. No. 11/468,512, filed Aug. 30, 2006.

FIELD OF THE INVENTION

The present invention relates to demultiplexers using transistors, and more particularly, to demultiplexers using transistors for accessing sublithographic memory cell arrays.

BACKGROUND OF THE INVENTION

In the prior art, to select one of multiple rows of a memory cell array, a demultiplexer circuit is used. Therefore, there is a need for a demultiplexer circuit (and methods for forming and operating the same), which is simpler than that of the prior art, for accessing the (sublithographic) memory cell array. It should be noted that sublithography is a method for forming structures having smaller pitches than can be formed by conventional lithography.

SUMMARY OF THE INVENTION

The present invention provides a semiconductor structure, comprising (a) a substrate; (b) $2^N$ semiconductor regions on the substrate, wherein N is a positive integer, and wherein the $2^N$ semiconductor regions are parallel to one another and run in a first direction; (c) first N gate electrode lines on the $2^N$ semiconductor regions, such that an intersection transistor exists at each of intersections between the first N gate electrode lines and the $2^N$ semiconductor regions, wherein the first N gate electrode lines run in a second direction which is perpendicular to the first direction, and wherein the first N gate electrode lines are electrically insulated from the $2^N$ semiconductor regions; (d) a contact region electrically coupled to the $2^N$ semiconductor regions; and (e) a first plurality of memory cells on the $2^N$ semiconductor regions, wherein the first N gate electrode lines are disposed between the first plurality of memory cells and the contact region, wherein in response to pre-specified voltage potentials being applied to the contact region and the first N gate electrode lines, memory cells of the first plurality of memory cells on only one of the $2^N$ semiconductor regions are selected, and wherein intersection transistors on each semiconductor region of the $2^N$ semiconductor regions form a unique combination in terms of channel types.

The present invention provides a device operation method, comprising providing a semiconductor structure which includes (a) a substrate, (b) $2^N$ semiconductor regions on the substrate, wherein N is a positive integer, and wherein the $2^N$ semiconductor regions are parallel to one another and run in a first direction, (c) first N gate electrode lines on the $2^N$ semiconductor regions, such that an intersection transistor exists at each of intersections between the first N gate electrode lines and the $2^N$ semiconductor regions, wherein the first N gate electrode lines run in a second direction which is perpendicular to the first direction, and wherein the first N gate electrode lines are electrically insulated from the $2^N$ semiconductor regions, (d) a contact region electrically coupled to the $2^N$ semiconductor regions, and (e) a first plurality of memory cells disposed on the $2^N$ semiconductor regions, wherein the first N gate electrode lines are disposed between the first plurality memory cells and the contact region, and wherein intersection transistors on each semiconductor region of the $2^N$ semiconductor regions form a unique combination in terms of channel types; and selecting only one of the $2^N$ semiconductor regions by applying pre-specified voltages to the contact region and the first N gate electrode lines.

The present invention provides a semiconductor fabrication method, comprising providing a semiconductor structure which includes a substrate; forming $2^N$ semiconductor regions on the substrate, wherein N is a positive integer, and wherein the $2^N$ semiconductor regions are parallel to one another and run in a first direction; forming first N gate electrode lines on the $2^N$ semiconductor regions, such that an intersection transistor exists at each of intersections between the first N gate electrode lines and the $2^N$ semiconductor regions, wherein the first N gate electrode lines run in a second direction which is perpendicular to the first direction, and wherein the first N gate electrode lines are electrically insulated from the $2^N$ semiconductor regions; forming a contact region electrically coupled to the $2^N$ semiconductor regions; and forming a first plurality of memory cells disposed on the $2^N$ semiconductor regions, wherein the first N gate electrode lines are disposed between the first plurality of memory cells and the contact region, wherein in response to pre-specified voltage potentials being applied to the contact region and the first N gate electrode lines, memory cells of the first plurality of memory cells disposed on only one of the $2^N$ semiconductor regions are selected, and wherein intersection transistors on each semiconductor region of the $2^N$ semiconductor regions form a unique combination in term of P channel transistor and N channel transistor.

The present invention provides a semiconductor structure, comprising (a) a substrate; (b) $2^N$ semiconductor regions on the substrate, N being an integer greater than 1; (c) $2^M$ semiconductor regions on the substrate, M being an integer greater than 1; wherein the $2^N$ semiconductor regions and the $2^M$ semiconductor regions run in a first direction, wherein all the $2^N$ semiconductor regions and the $2^M$ semiconductor regions run through a memory cell array area of the substrate, wherein the $2^N$ semiconductor regions but not the $2^M$ semiconductor regions run through a first interfacing area of the substrate which abuts the memory cell array area, wherein the $2^M$ semiconductor regions but not the $2^N$ semiconductor regions run through a second interfacing area of the substrate which abuts the memory cell array area, wherein the memory cell array area is disposed between the first and second interfacing areas, and wherein in the memory cell array area, for any two consecutive semiconductor regions of the $2^N$ semiconductor regions, there is a semiconductor region of the $2^M$ semiconductor regions sandwiched between the two consecutive semiconductor regions; (d) N gate electrode lines on the $2^N$ semiconductor regions and in the first interfacing area, such that an intersection transistor exists at each of intersections between the N gate electrode lines and the $2^N$ semiconductor regions in the first interfacing area, wherein the N gate electrode lines run in a second direction which is perpendicular to the first direction, wherein the N gate electrode lines are electrically insulated from the $2^N$ semiconductor regions, and wherein intersection transistors on each semiconductor region of the $2^N$ semiconductor regions form a unique combination in terms of channel type; and (e) M gate electrode lines on the $2^M$ semiconductor regions and in the second interfacing area, such that an intersection transistor exists at each of the intersections between the M gate electrode lines and the $2^M$ semiconductor regions in the second interfacing area, wherein the M gate electrode lines run in a second direction which is perpendicular to the first direction, wherein the M gate electrode lines are electrically insulated from the $2^M$ semiconductor regions, and wherein intersection transistors on each semiconductor region of the $2^M$ semiconductor regions form a unique combination in terms of channel type.

The present invention provides a demultiplexer circuit (and methods for forming and operating the same), which is simpler than that of the prior art, for accessing the (sublithographic) memory cell array.

DETAILED DESCRIPTION OF THE INVENTION

Figure 1:
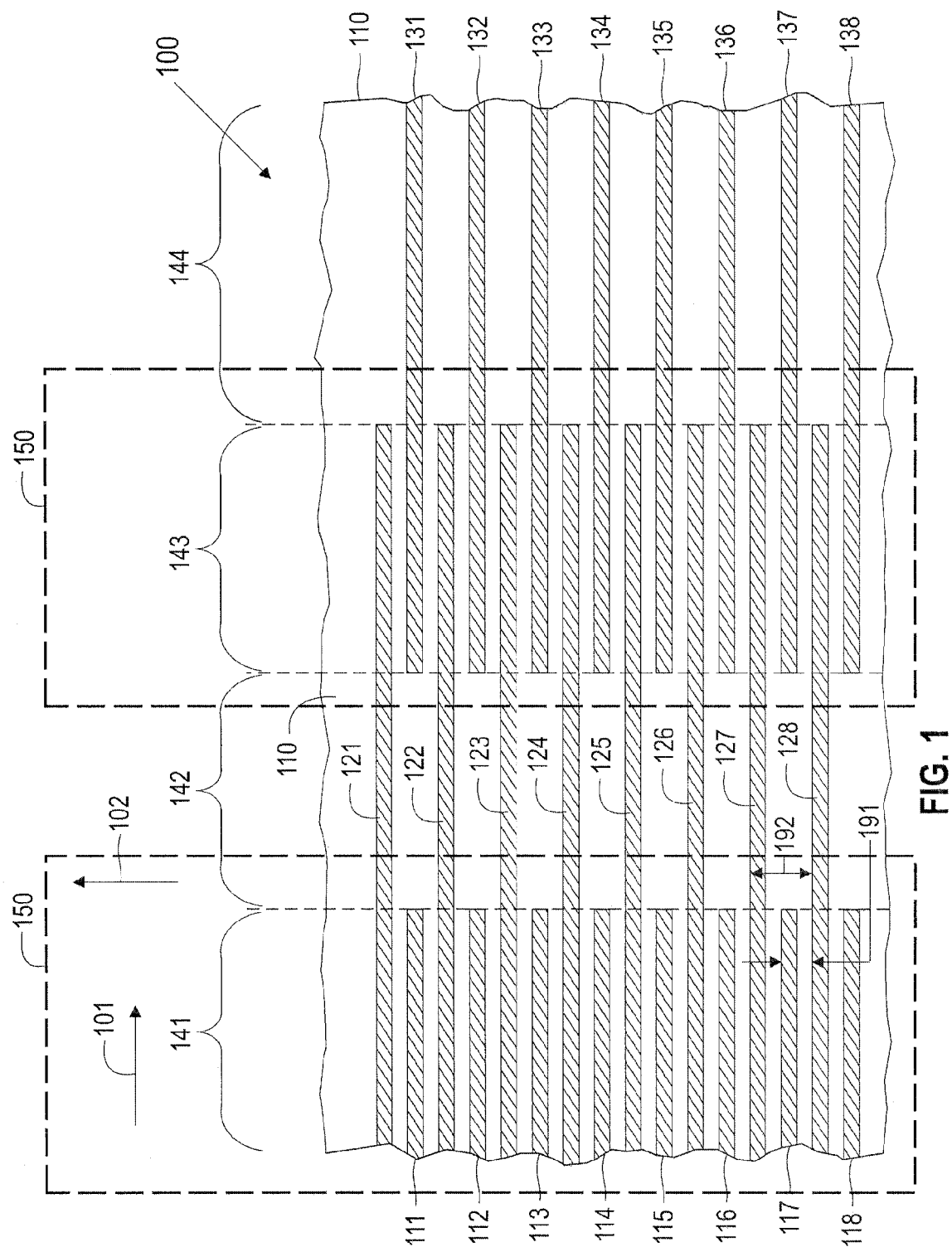
FIGS. 1-2A illustrate a first semiconductor structure, in accordance with embodiments of the present invention.

FIG. 1 shows a top down view of a semiconductor structure 100, in accordance with embodiments of the present invention. More specifically, with reference to FIG. 1, in one embodiment, the semiconductor structure 100 comprises a dielectric layer 110 and fin regions 111-118, 121-128, and 131-138 on top of the dielectric layer 110. In one embodiment, the dielectric layer 110 comprises silicon dioxide. In one embodiment, the fin regions 111-118, 121-128, and 131-138 comprise silicon. In one embodiment, the fin regions 111-118, 121-128, and 131-138 are formed in a direction 101 and staggered as shown in FIG. 1.

In one embodiment, the structure 100 further comprises cross lines (not shown in FIG. 1 but shown as cross lines 911-916 in FIG. 1B) running in a direction 102 (essentially perpendicular to direction 101) in the areas 141 and 143.

Figure 1A:
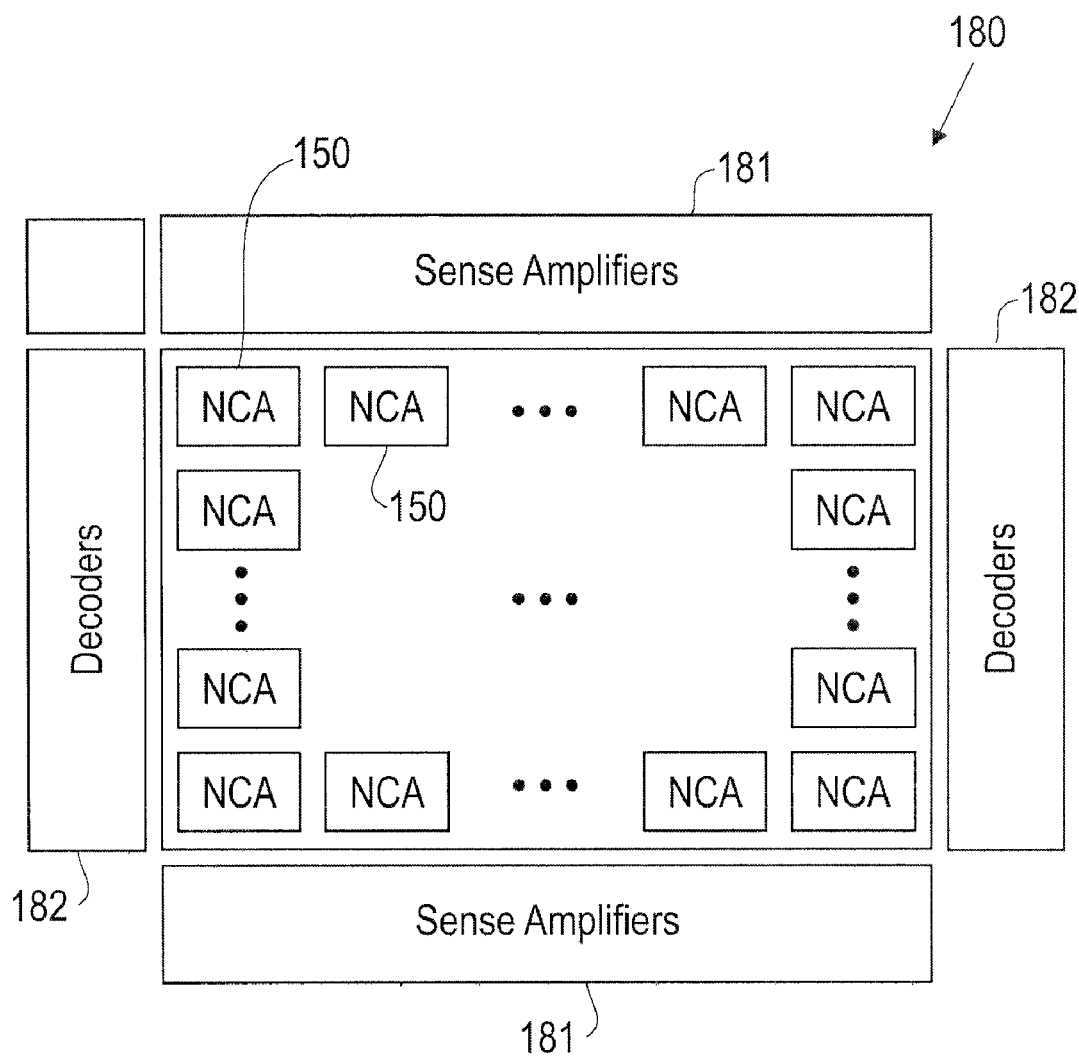

With reference to FIG. 1, it should be noted that the two regions 150 can be referred to as nanoscale crossbar array (NCA) regions 150; multiple NCAs 150 are shown in FIG. 1A. More details of NCAs 150 will be described later with reference to FIG. 1A.

FIG. 1A is a zoom-out view of FIG. 1, in accordance with embodiments of the present invention. In one embodiment, FIG. 1A describes a memory system 180 that comprises decoders 182, sense amplifiers 181, and NCAs 150.

Figure 1B:
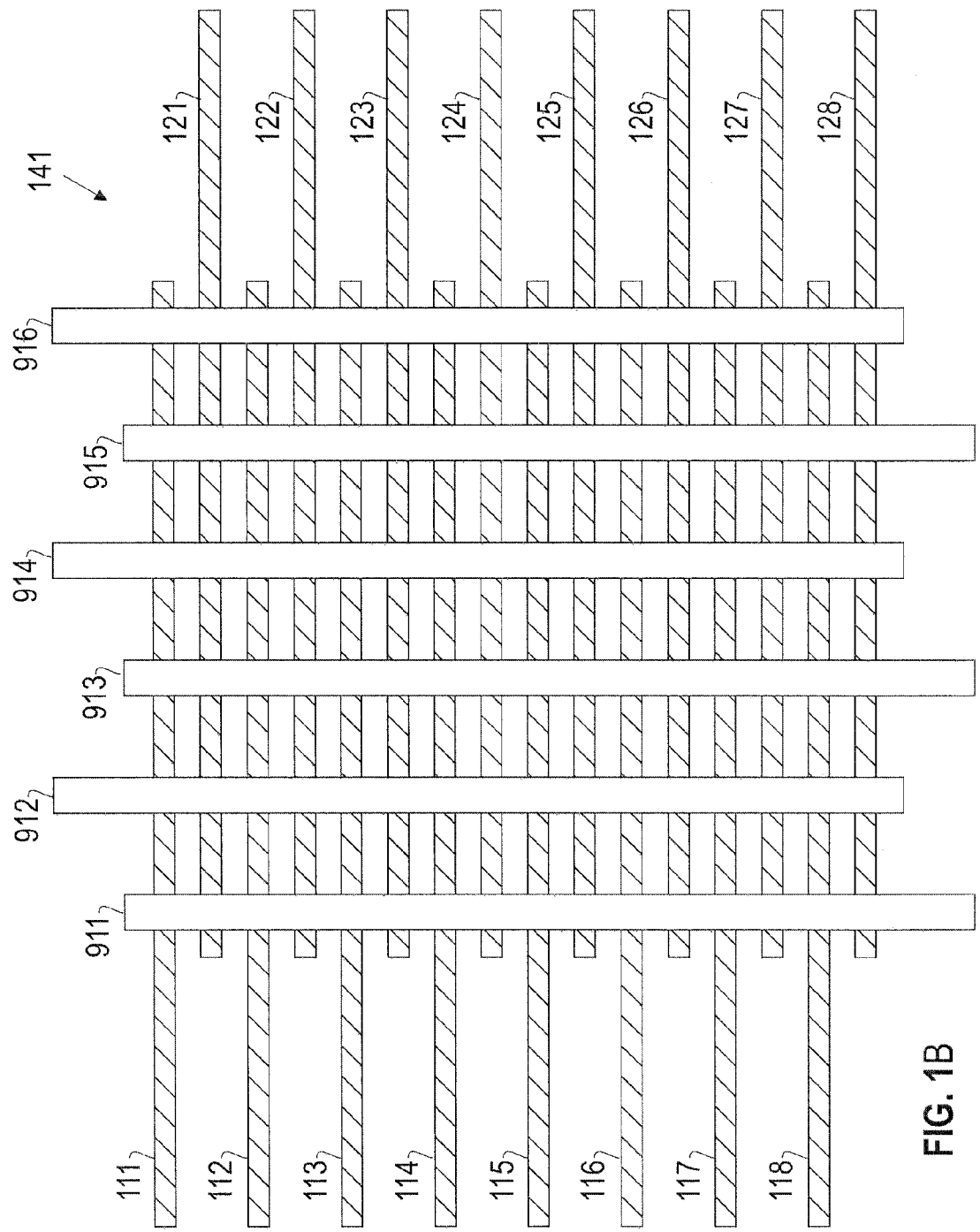

FIG. 1B shows details of the area 141 of FIG. 1, in accordance with embodiments of the present invention. In one embodiment, in addition to comprising segments of the fin regions 111-118 and 121-128, the area 141 further comprises the cross lines 911-916. In one embodiment, at each intersection of the cross lines 911-916 and the fin regions 111-118 and 121-128, a memory cell (not shown for simplicity) can be formed. As a result, the area 141 can be referred to as the memory cell array area 141. In one embodiment, the area 143 has a similar structure as the area 141. As a result, the area 143 can also be referred to as the memory cell array area 143.

In one embodiment, with reference to FIGS. 1 and 1B, both (i) the fin regions 111-118, 121-128, and 131-138 and (ii) the cross lines 911-916 are formed using sublithography. Alternatively, either (i) the fin regions 111-118, 121-128, and 131-138 or (ii) the cross lines 911-916 are formed using sublithography whereas the other is formed using regular lithography. In one embodiment, the structure 100 further comprises gate electrode lines (not shown in FIG. 1 for simplicity, but shown in later figures) running in the direction 102 in areas 142 and 144. In one embodiment, at each intersection of the gate electrode lines and the fin regions 121-128 and 131-138 in areas 142 and 144, a FINFET (Field Effect Transistor) (not shown) can be formed.

With reference to FIGS. 1 and 1B, it should be noted that, the fin regions 111-118, 121-128, and 131-138 are staggered such that a pitch 191 of the fin regions in the memory cell array areas 141 and 143 is less than the pitch 192 of the fin regions in the areas 142 and 144. In one embodiment, the pitch 192 is twice the pitch 191. Illustratively, the pitch 191 is about 20 nm and the pitch 192 is about 40 nm if the sublithographic fins are 10 nm line and space in areas 141 and 143.

As a result of the pitch 192 being larger than the pitch 191, the areas 142 and 144 are less populated by the fin regions. Therefore, it is easier to form, aligned to the fins, specific doping patterns and contacts (not shown) in the areas 142 and 144. As a result, the areas 142 and 144 can be referred to as interfacing areas 142 and 144, respectively, which electrically couple the memory cell array areas 141 and 143 to external circuits (not shown).

Figure 2:
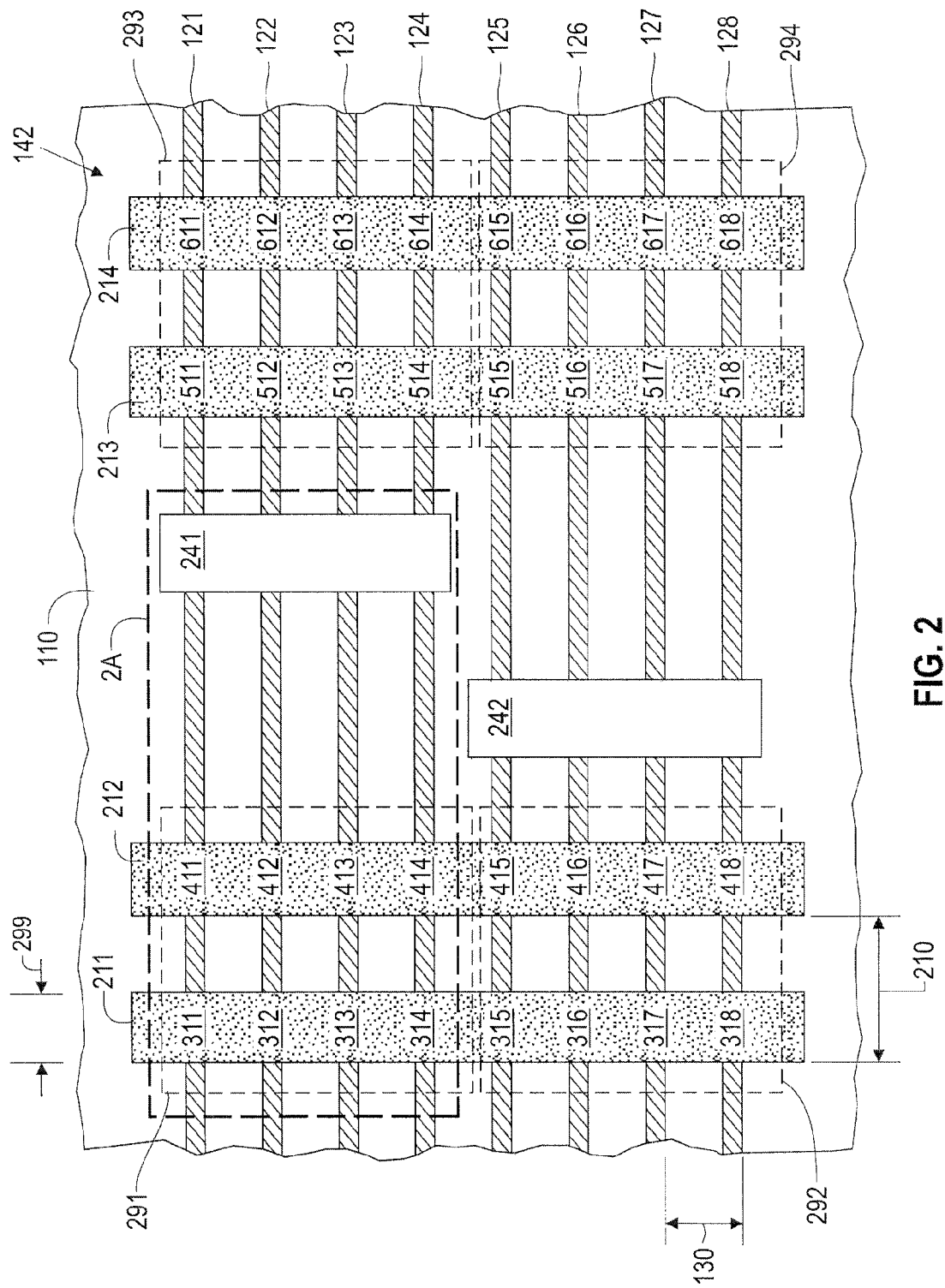

FIG. 2 shows a zoom-in top down view of the interfacing area 142 of the semiconductor structure 100 of FIG. 1, in accordance with embodiments of the present invention. In one embodiment, the interfacing area 142 comprises the fin regions 121-128, gate electrode lines 211, 212, 213, and 214, and contact regions 241 and 242. In one embodiment, the gate electrode lines 211, 212, 213, and 214 and the fin regions 121-128 are electrically insulated from each other by a dielectric layer (not shown). In one embodiment, the gate electrode lines 211, 212, 213, and 214 comprise polysilicon. The formation of the dielectric layer will be described later with reference to FIG. 3C.

In one embodiment, at intersections of the gate electrode lines 211, 212, 213, and 214 and the fin regions 121-128, there are transistors 311-318, 411-418, 511-518, and 611-618. In one embodiment, the contact region 241 is electrically connected to the fin regions 121-124, whereas the contact region 242 is electrically connected to the fin regions 125-128.

In one embodiment, the transistors 312, 313, 316, 317, 413, 414, 417, 418, 512, 513, 516, 517, 613, 614, 617, 618 are N channel transistors, whereas, the transistors 311, 314, 315, 318, 411, 412, 415, 416, 511, 514, 515, 518, 611, 612, 615, 616 are P channel transistors.

It should be noted that, in a group 291 of the transistors 311-314 and 411-414, each of transistor pairs 311 and 411, 312 and 412, 313 and 413, and 314 and 414 forms a unique combination of channel types. More specifically, the transistor pair 311 and 411 forms a unique combination of P-P channel type. The transistor pair 312 and 412 forms a unique combination of N-P channel type. The transistor pair 313 and 413 forms a unique combination of N-N channel type. The transistor pair 314 and 414 forms a unique combination of P-N channel type. Similarly, in a group 292 of transistors 315-318 and 415-418, each of transistor pairs 315 and 415, 316 and 416, 317 and 417, and 318 and 418 forms a unique combination of channel types. Similarly, in a group 293 of transistors 511-514 and 611-614, each of transistor pairs 511 and 611, 512 and 612, 513 and 613, and 514 and 614 forms a unique combination of channel types. Similarly, in a group 294 of transistors 515-518 and 615-618, each of transistor pairs 515 and 615, 516 and 616, 517 and 617, and 518 and 618 forms a unique combination of channel types.

It should be noted that, the contact region 241 and the gate electrode lines 211 and 212 help select one of the four fin regions 121-124 in memory cell array areas 141. The contact region 241 and the gate electrode lines 213 and 214 help select one of the four fin regions 121-124 in memory cell array areas 143. Similarly, the contact region 242 and the gate electrode lines 213 and 214 help select one of the four fin regions 125-128 in memory cell array areas 143. The contact region 242 and the gate electrode lines 211 and 212 help select one of the four fin regions 125-128 in memory cell array areas 141.

In the embodiments described above, with reference to FIG. 2, the contact region 241 and the gate electrode lines 211 and 212 can be used to select one of the four fin regions 121-124. Alternatively, the contact region 241 can be formed to be electrically coupled to only the fin regions 121 and 122. In this case, only the gate electrode line 211 is needed to select one of the two fin regions 121 and 122. In general, if the contact region 241 is electrically coupled to $2^N$ fin regions (N is a positive integer), then N gate electrode lines are needed to help select one of the $2^N$ fin regions.

As a first example of the operation of the interfacing area 142 of FIG. 2, assume that, the fin region 124 is to be selected to access a memory cell (not shown) in the fin region 124 of the memory cell array area 141 (FIG. 1). As a result, in one embodiment, 5V is applied to the contact region 241; 0V is applied to the contact region 242; −5V is applied to the gate electrode line 211; and 5V is applied to the gate electrode line 212. Therefore, the P channel transistor 314 and the N channel transistor 414 are both turned on, resulting in the fin region 124 of the memory cell array area 141 being selected. It should be noted that the voltages 0V, −5V, and +5V used herein are for illustration only. In general, the applied voltages should be such that the N channel and P channel transistors can be turned on and off as desired. In other words, the applied voltages should be selected with respect to the threshold voltages of the N channel and P channel transistors involved.

It should be noted that, because 5V is applied to the gate electrode line 212, the P channel transistor 411 is off, resulting in the fin region 121 of the memory cell array area 141 not being selected. Similarly, because −5V is applied to the gate electrode line 211, the N channel transistor 312 is off, resulting in the fin region 122 of the memory cell array area 141 not being selected. Similarly, because −5V is applied to the gate electrode line 211, the N channel transistor 313 is off, resulting in the fin region 123 of the memory cell array area 141 not being selected. It should be noted that, the fin regions 125-128 of the memory cell array areas 141 and 143 (FIG. 1) are not selected, because 0V is applied to the contact region 242. In one embodiment, the voltages applied to the gate electrode lines 213 and 214 can be selected (such as 0 volts) such that none of the four fin regions 121-124 of the memory cell array area 143 (FIG. 1) is selected.

In summary of the first example, if the fin region 124 of the memory cell array area 141 (FIG. 1) is to be selected, then −5V and 5V are applied to the gate electrode lines 211 and 212, respectively; and 5V and 0V are applied to the contact regions 241 and 242, respectively. Similarly, if the fin region 121 of memory cell array area 141 (FIG. 1) is to be selected, then −5V is applied to both the gate electrode lines 211 and 212; and 5V and 0V are applied to the contact regions 241 and 242, respectively. Similarly, if the fin region 122 of memory cell array area 141 (FIG. 1) is to be selected, then 5V and −5V are applied to the gate electrode lines 211 and 212, respectively; and 5V and 0V are applied to the contact regions 241 and 242, respectively. Similarly, if the fin region 123 of memory cell array area 141 (FIG. 1) is to be selected, then 5V is applied to both the gate electrode lines 211 and 212; 5V and 0V are applied to the contact regions 241 and 242, respectively.

As a second example of the operation of the interfacing area 142 of FIG. 2, assume that, the fin region 128 is to be selected to access a memory cell (not shown) disposed on the fin region 128 of the memory cell array area 141 (FIG. 1). As a result, in one embodiment, 0V is applied to the contact region 241; 5V is applied to the contact region 242; −5V is applied to the gate electrode line 211; and 5V is applied to the gate electrode line 212. Therefore, the P channel transistor 318 and the N channel transistor 418 are both turned on, resulting in the fin region 128 of the memory cell array area 141 being selected.

It should be noted that, because 5V is applied to the gate electrode line 212, the P channel transistor 415 is off, resulting in the fin region 125 of the memory cell array area 141 not being selected. Similarly, because −5V is applied to the gate electrode line 211, the N channel transistor 316 is off, resulting in the fin region 126 of the memory cell array area 141 not being selected. Similarly, because −5V is applied to the gate electrode line 211, the N channel transistor 317 is off, resulting in the fin region 127 of the memory cell array area 141 not being selected. It should be noted that, the fin regions 121-124 of the memory cell array areas 141 and 143 (FIG. 1) are not selected, because 0V is applied to the contact region 241. In one embodiment, the voltages applied to the gate electrode lines 213 and 214 can be selected (such as 0 volts) such that none of the four fin regions 125-128 of the memory cell array area 143 (FIG. 1) is selected.

In summary of the second example, if the fin region 128 of the memory cell array area 141 (FIG. 1) is to be selected, then −5V and 5V are applied to the gate electrode lines 211 and 212, respectively; and 0V and 5V are applied to the contact regions 241 and 242, respectively. Similarly, if the fin region 125 of memory cell array area 141 (FIG. 1) is to be selected, then −5V is applied to both the gate electrode lines 211 and 212; and 0V and 5V are applied to the contact regions 241 and 242, respectively. Similarly, if the fin region 126 of memory cell array area 141 (FIG. 1) is to be selected, then 5V and −5V are applied to the gate electrode lines 211 and 212, respectively; and 0V and 5V are applied to the contact regions 241 and 242, respectively. Similarly, if the fin region 127 of memory cell array area 141 (FIG. 1) is to be selected, then 5V is applied to both the gate electrode lines 211 and 212; and 0V and 5V are applied to the contact regions 241 and 242, respectively.

As a third example of the operation of the interfacing area 142 of FIG. 2, assume that, the fin region 124 is to be selected to access a memory cell (not shown) disposed on the fin region 124 of the memory cell array area 143 (FIG. 1). As a result, in one embodiment, 5V is applied to the contact region 241; 0V is applied to the contact region 242; −5V is applied to the gate electrode line 213; and 5V is applied to the gate electrode line 214. Therefore, the P channel transistor 514 and the N channel transistor 614 are both turned on, resulting in the fin region 124 of the memory cell array area 143 being selected.

It should be noted that, because 5V is applied to the gate electrode line 214, the P channel transistor 611 is off, resulting in the fin region 121 of the memory cell array area 143 not being selected. Similarly, because −5V is applied to the gate electrode line 213, the N channel transistor 512 is off, resulting in the fin region 122 of the memory cell array area 143 not being selected. Similarly, because −5V is applied to the gate electrode line 213, the N channel transistor 513 is off, resulting in the fin region 123 of the memory cell array area 143 not being selected. It should be noted that, the fin regions 125-128 of the memory cell array areas 143 and 141 are not selected, because 0V is applied to the contact region 242. It should be noted that in this third example, the voltages applied to the gate electrode lines 211 and 212 can be selected (such as 0 volts) such that none of the four fin regions 121-124 of the memory cell array area 141 (FIG. 1) is selected.

In summary of the third example, if the fin region 124 of the memory cell array area 143 (FIG. 1) is to be selected, then –5V and 5V are applied to the gate electrode lines 213 and 214, respectively; and 5V and 0V are applied to the contact regions 241 and 242, respectively. Similarly, if the fin region 121 of memory cell array area 143 (FIG. 1) is to be selected, then –5V is applied to both the gate electrode lines 213 and 214; and 5V and 0V are applied to the contact regions 241 and 242, respectively. Similarly, if the fin region 122 of memory cell array area 143 (FIG. 1) is to be selected, then 5V and –5V are applied to the gate electrode lines 213 and 214, respectively; and 5V and 0V are applied to the contact regions 241 and 242, respectively. Similarly, if the fin region 123 of memory cell array area 143 (FIG. 1) is to be selected, then 5V is applied to both the gate electrode lines 213 and 214; and 5V and 0V are applied to the contact regions 241 and 242, respectively.

As a fourth example of the operation of the interfacing area 142 of FIG. 2, assume that, the fin region 128 is to be selected to access a memory cell (not shown) disposed on the fin region 128 of the memory cell array area 143 (FIG. 1). As a result, in one embodiment, 0V is applied to the contact region 241; 5V is applied to the contact region 242; –5V is applied to the gate electrode line 213; and 5V is applied to the gate electrode line 214. Therefore, the P channel transistor 518 and the N channel transistor 618 are both turned on, resulting in the fin region 128 of the memory cell array area 143 being selected.

It should be noted that, because 5V is applied to the gate electrode line 214, the P channel transistor 615 is off, resulting in the fin region 125 of the memory cell array area 143 not being selected. Similarly, because –5V is applied to the gate electrode line 213, the N channel transistor 516 is off, resulting in the fin region 126 of the memory cell array area 143 not being selected. Similarly, because –5V is applied to the gate electrode line 213, the N channel transistor 517 is off, resulting in the fin region 127 of the memory cell array area 143 not being selected. It should be noted that, the fin regions 121-124 of the memory cell array areas 141 and 143 are not selected, because 0V is applied to the contact region 241. In one embodiment, the voltages applied to the gate electrode lines 211 and 212 can be selected such that none of the four fin regions 125-128 of the memory cell array area 141 (FIG. 1) is selected.

In summary of the fourth example, if the fin region 128 of the memory cell array area 143 (FIG. 1) is to be selected, then –5V and 5V are applied to the gate electrode lines 213 and 214, respectively; and 0V and 5V are applied to the contact regions 241 and 242, respectively. Similarly, if the fin region 125 of memory cell array area 143 (FIG. 1) is to be selected, then –5V is applied to both the gate electrode lines 213 and 214; and 0V and 5V are applied to the contact regions 241 and 242, respectively. Similarly, if the fin region 126 of memory cell array area 143 (FIG. 1) is to be selected, then 5V and –5V are applied to the gate electrode lines 213 and 214, respectively; and 0V and 5V are applied to the contact regions 241 and 242, respectively. Similarly, if the fin region 127 of memory cell array area 143 (FIG. 1) is to be selected, then 5V is applied to both the gate electrode lines 213 and 214; and 0V and 5V are applied to the contact regions 241 and 242, respectively.

As a fifth example of the operation of the interfacing area 142 of FIG. 2, assume that, the fin region 124 is to be selected to access simultaneously two memory cells (not shown) disposed on the fin region 124 of the two memory cell array areas 141 and 143 (FIG. 1). As a result, in one embodiment, 5V is applied to the contact region 241; 0V is applied to the contact region 242; –5V is applied to both the gate electrode lines 211 and 213; and 5V is applied to the gate electrode lines 212 and 214. Therefore, the P channel transistors 314 and 514 and the N channel transistors 414 and 614 are turned on, resulting in the fin region 124 of the memory cell array areas 141 and 143 being selected.

In one embodiment, when going from one fin region to the next, there is only one doping change in the transistor pair/combination. For example, when going from fin region 121 to fin region 122, there is only one doping change between P-P transistor pair and N-P transistor pair. Similarly, when going from fin region 122 to fin region 123, there is only one doping change between N-P transistor pair and N-N transistor pair. Similarly, when going from fin region 123 to fin region 124, there is only one doping change between N-N transistor combination and P-N transistor combination. It should be noted that a change from P-P transistor pair to N-N transistor pair would involve two doping changes.

As a sixth example of the operation of the interfacing area 142 of FIG. 2, in one embodiment, 0V is applied to both the contact regions 241 and 242. As a result, none of the eight fin regions 121-128 of the memory cell array area 141 or 143 is selected.

In one embodiment, the gate electrode lines 211-214 are formed using a standard lithography and etching process. In one embodiment, the fin regions 121-128 are formed using a sub-lithography (e.g., self-assembly and/or nanoimprint lithography and/or sidewall definition techniques) and etching processes. Therefore, the pitch 210 of the gate electrode lines 211-212 is greater than the pitch 130 of the fin regions 127-128.

Figure 2A:
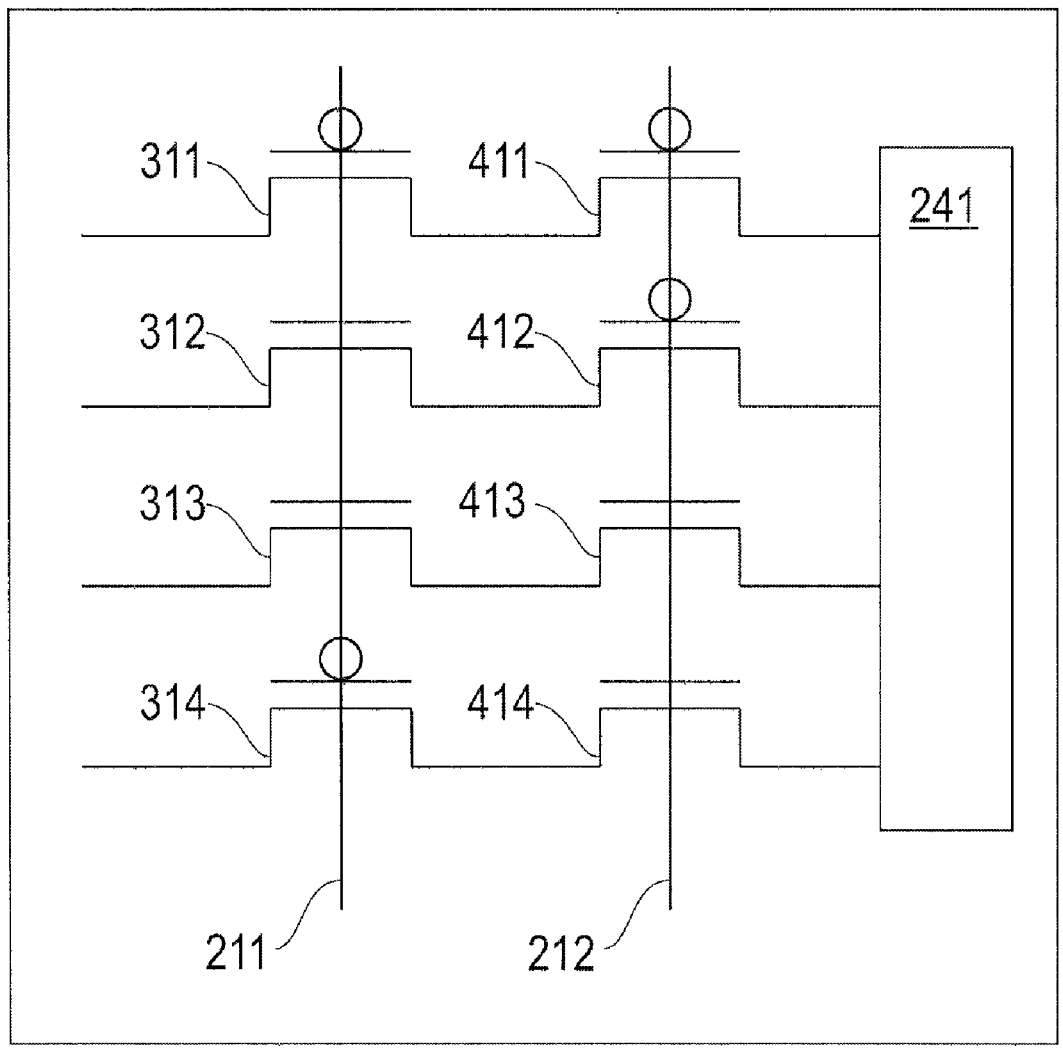

FIG. 2A is an electric diagram of region 2A of FIG. 2.

Figure 3:
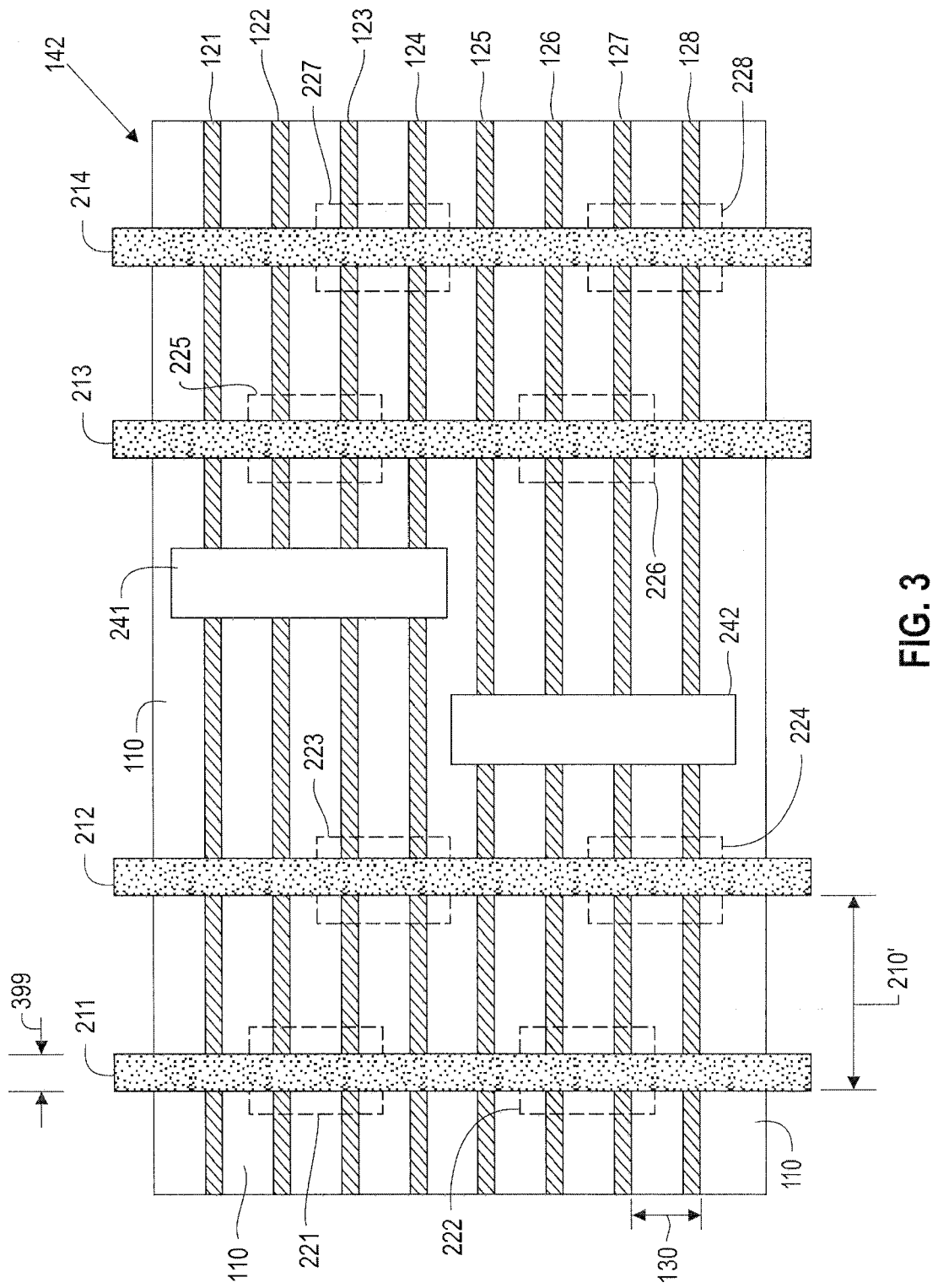
FIG. 3 illustrates a second semiconductor structure, in accordance with embodiments of the present invention.

FIG. 3 shows another embodiment of the interfacing area 142 of FIG. 2, in accordance with embodiments of the present invention. In one embodiment, the interfacing area 142 of FIG. 3 is similar to the interfacing area 142 of FIG. 2 except that the critical dimension 399 of the gate electrode lines 211-212 of FIG. 3 is less than the critical dimension 299 of the gate electrode lines 211-212 of the FIG. 2. It should be noted that the similar regions of the two interfacing areas 142 of FIG. 2 and FIG. 3 have the same reference numerals. In one embodiment, the gate electrode lines 211-214 and the fin regions 121-128 (FIG. 3) are formed using conventional lithography and etching processes.

FIGS. 3A-3E show a fabrication process of the interfacing area 142 of FIG. 2, in accordance with embodiments of the present invention.

Figure 3A:
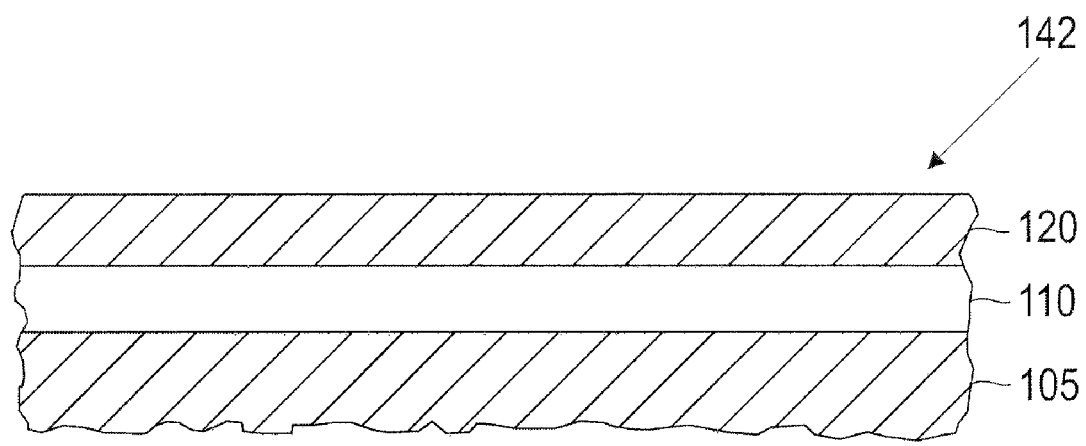
FIGS. 3A-3E show a fabrication process of the first semiconductor structure of FIG. 2, in accordance with embodiments of the present invention.

More specifically, with reference to FIG. 3A, in one embodiment, the fabrication process of the interfacing area 142 starts out with an SOI (silicon on insulator) substrate 105+110+120. Illustratively, the SOI substrate 105+110+120 comprises a silicon layer 105, a dielectric layer 110 (on top of the silicon layer 105) and a silicon layer 120 (on top of the dielectric layer 110). In one embodiment, the SOI substrate 105+110+120 is formed by a conventional method.

Figure 3B:
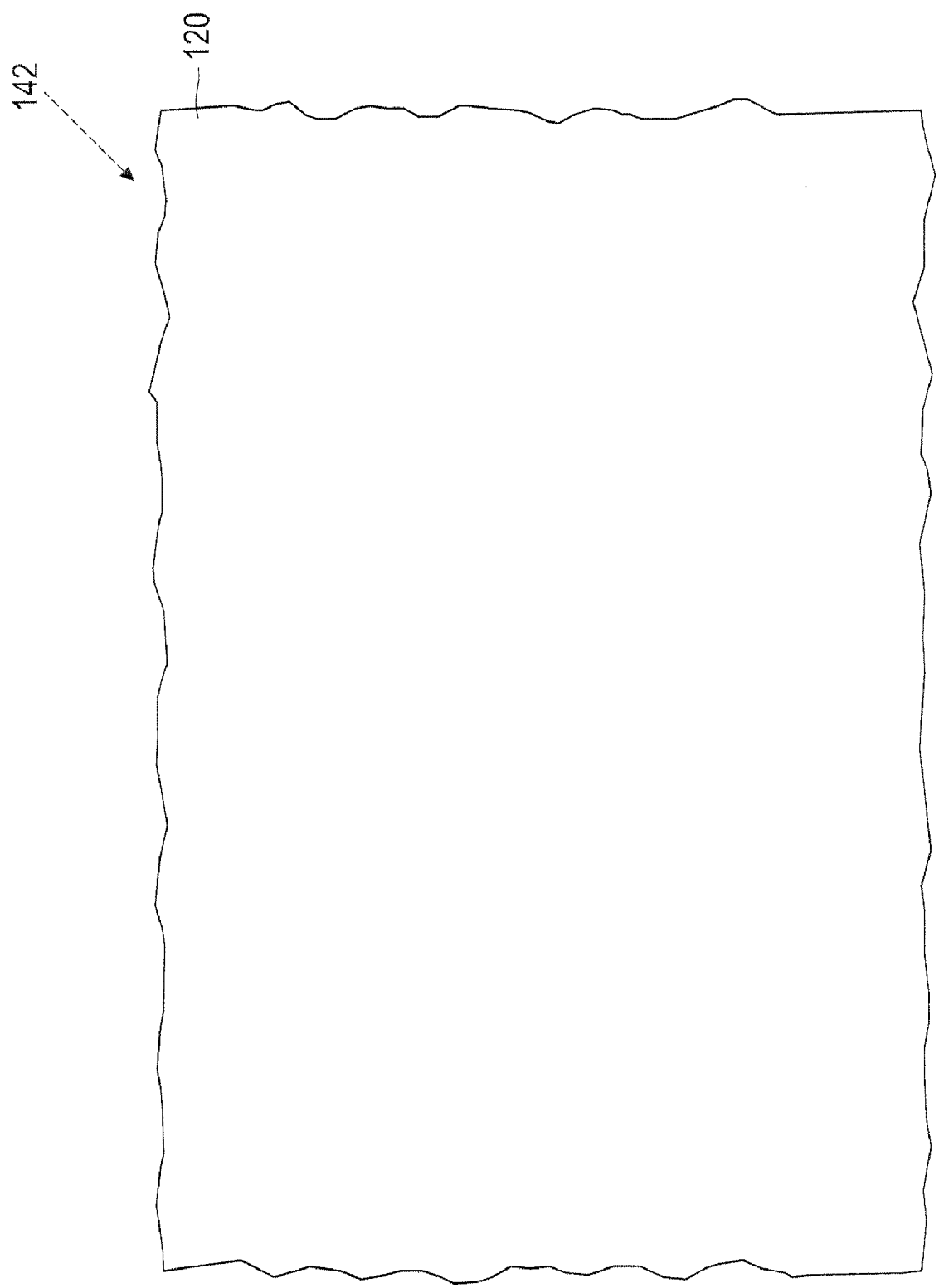

FIG. 3B shows a top down view of the interfacing area 142 of FIG. 3A. Next, in one embodiment, a dielectric hard mask layer (not shown) is formed on top of the silicon layer 120. Next, the dielectric hard mask layer is patterned. Next, in one embodiment, the patterned dielectric hard mask layer is used as a mask for etching the silicon layer 120, resulting in fin regions 121-128. Next, in one embodiment, the patterned dielectric hard mask layer is removed. Alternatively, the patterned dielectric hard mask layer remains.

Figure 3C:
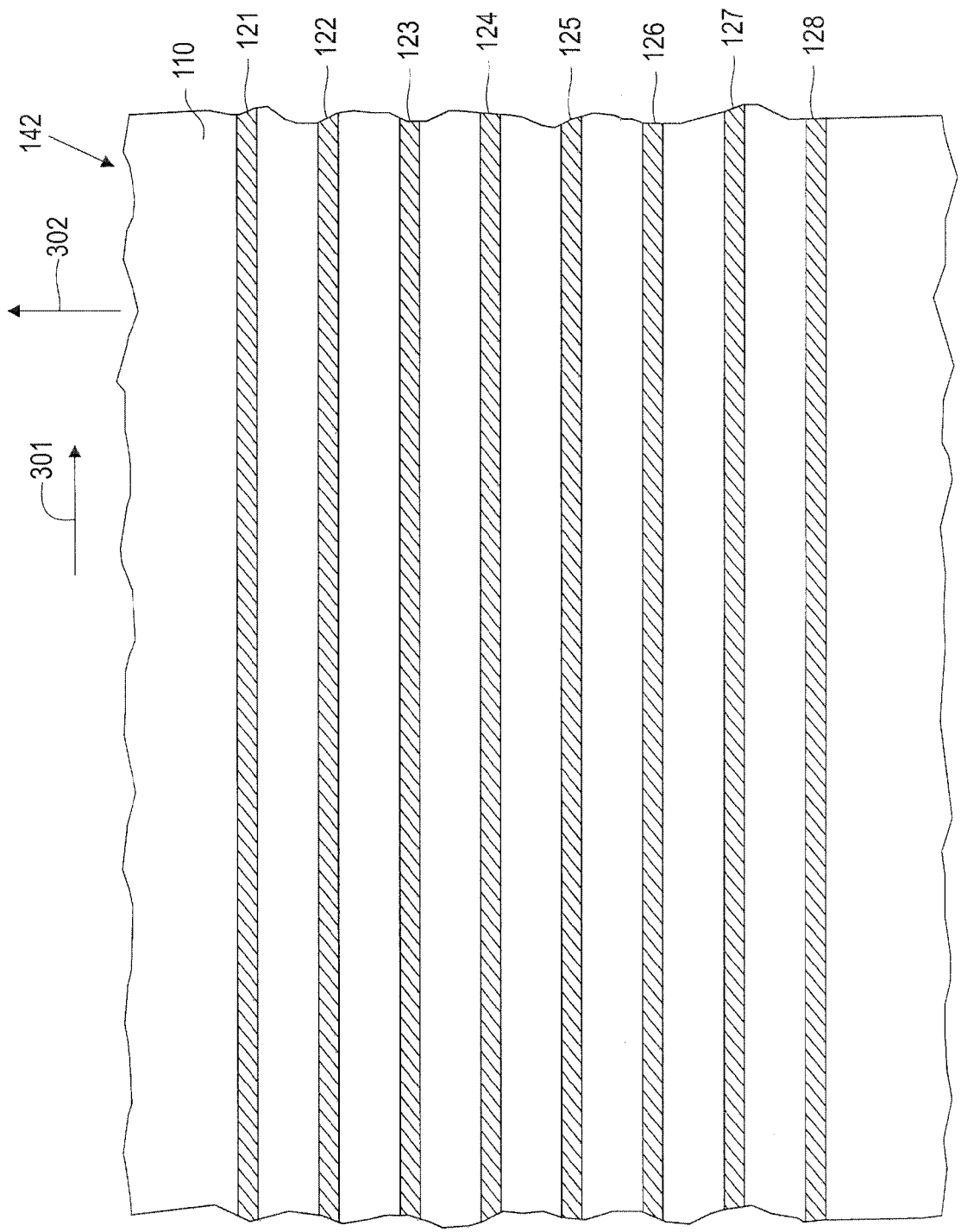

At this point in time, the fin regions 121-128 comprise silicon and the dielectric layer 110 is exposed to the surrounding ambient, as shown in FIG. 3C. Illustratively, the fin regions 121-128 are formed in a direction 301.

Next, in one embodiment, exposed silicon surfaces of the fin regions 121-128 are thermally oxidized. In one embodiment, optionally, a sacrificial oxidation step can be performed before the exposed silicon surface of the fin regions 121-128 are thermally oxidized. In an alternative embodiment, other dielectrics, such as high-K dielectrics, can be used to form gate dielectric layer on the exposed silicon surface of the fin region 121-128.

Figure 3D:
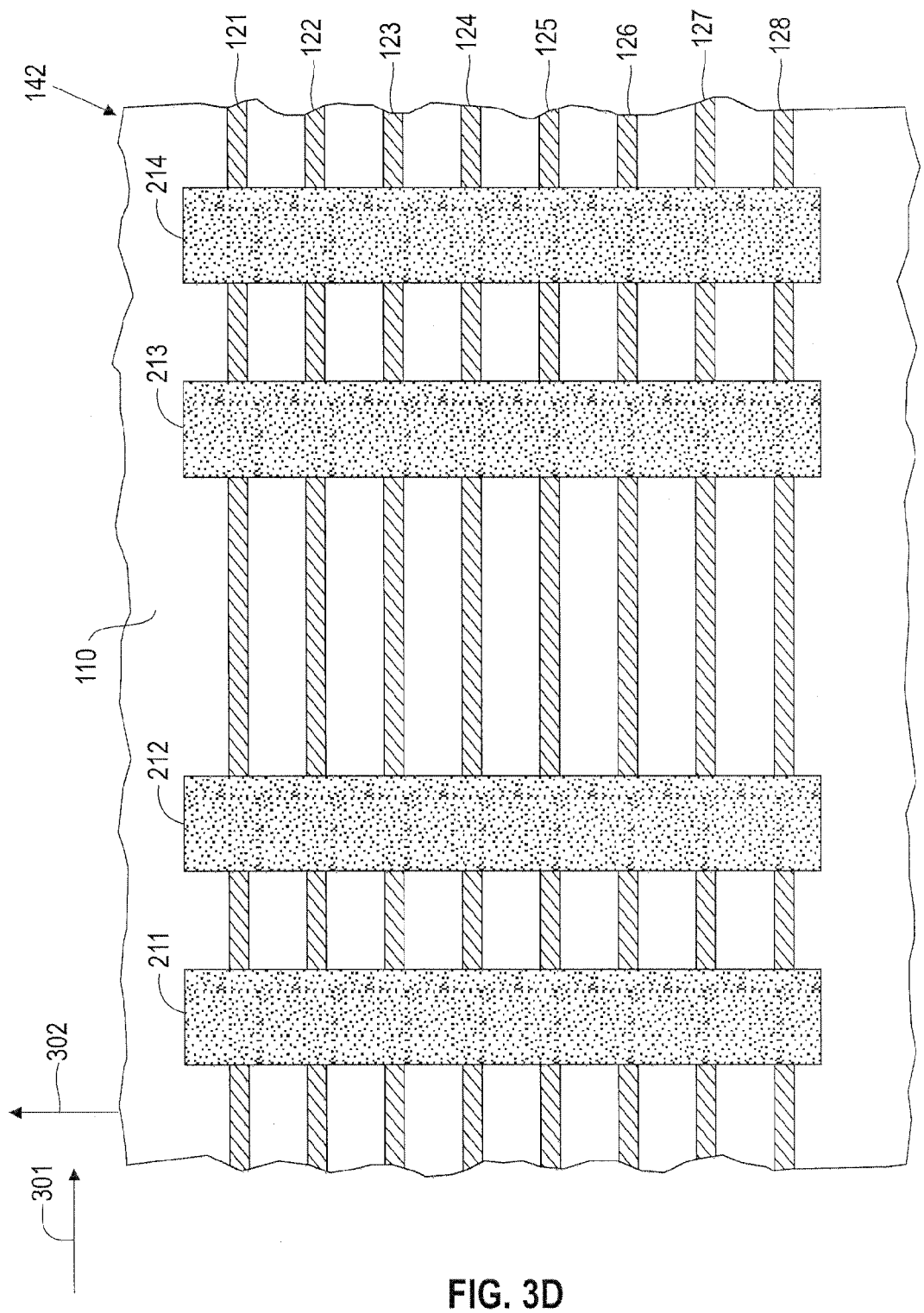

Next, with reference to FIG. 3D, in one embodiment, the gate electrode lines 211-214 are formed on top of the interfacing area 142 of FIG. 3C. In one embodiment, the gate electrode lines 211-214 are formed in a direction 302 which is essentially perpendicular to the direction 301. Illustratively, the gate electrode lines 211-214 comprise polysilicon or other options including metal gate. In one embodiment, the gate electrode lines 211-214 are formed by (i) CVD of polysilicon layer (not shown) everywhere on top of the interfacing area 142 of FIG. 3C, and then (ii) a standard lithography and etching process to pattern the deposited polysilicon layer, resulting in the gate electrode lines 211-214 as shown in FIG. 3D.

In one embodiment, the fin regions 121-128 are formed using sublithography whereas the gate electrode lines 211-214 are formed using regular lithography. As a result, the pitch of the gate electrode lines 211-214 is greater than the pitch of the fin regions 121-128.

It should be noted that, the fin regions 121-128 are formed in the direction 301, whereas the gate electrode lines 211-214 are formed in the direction 302. Therefore, there are intersections of the gate electrode lines 211-214 and the fin regions 121-128. At each intersection, a transistor (not shown in FIG. 3D but shown in FIG. 3E) can be subsequently formed.

Figure 3E:
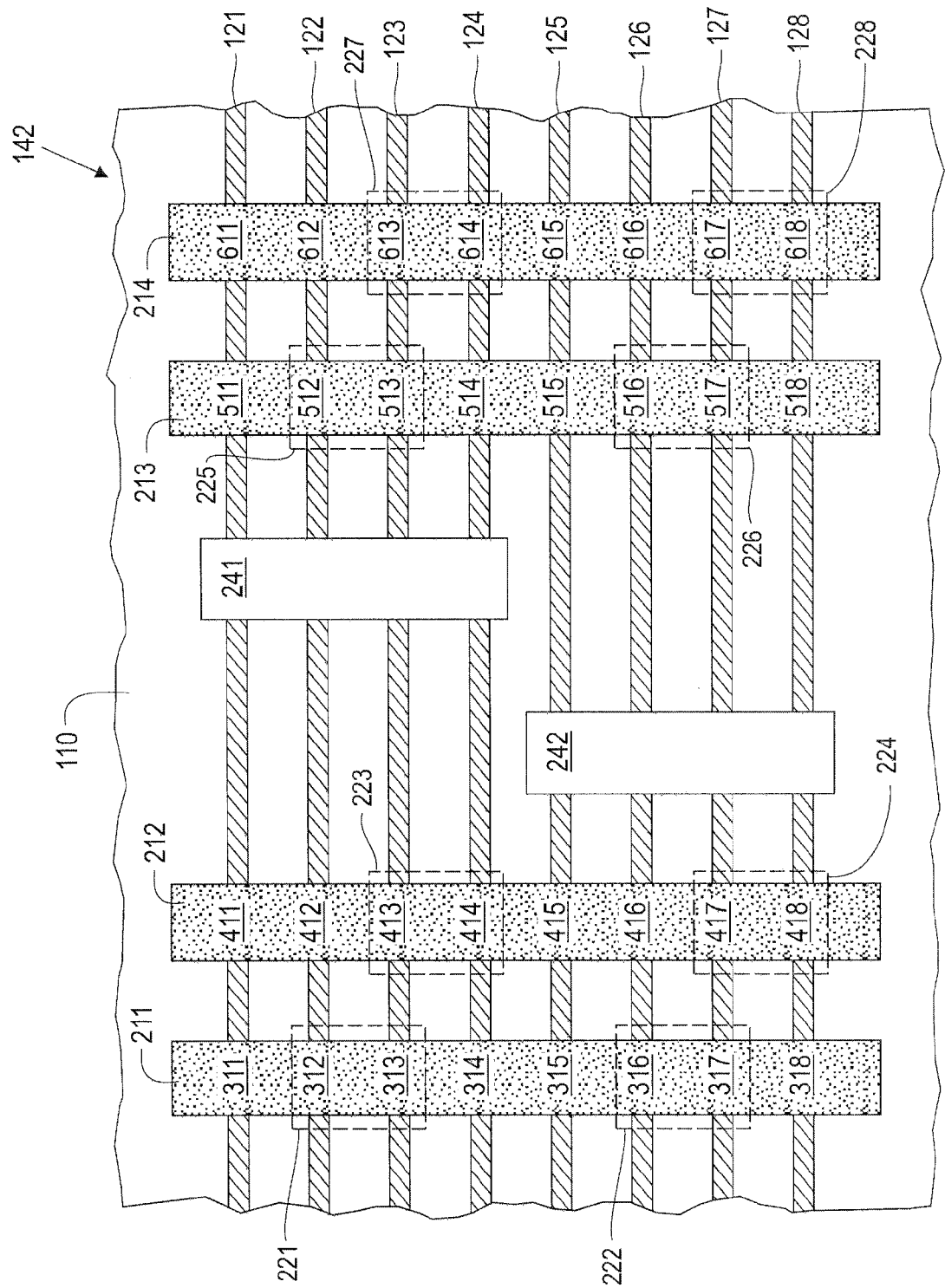

Next, with reference to FIG. 3E, in one embodiment, the gate electrode lines 211-214 are used as blocking masks to perform a P type doping process in which exposed portions of the fin regions 121-128 are doped with P type dopants. As a result, P channel transistors 311-318, 411-418, 511-518, and 611-618 are formed.

Next, in one embodiment, the P channel transistors in the areas 221-228 are counterdoped (in the S/D regions) into N channel transistors. More specifically, the conversion process can be performed by selectively doping (e.g., by photolithography followed by ion implantation) the areas 221-228 with N-type dopants at a higher doping concentration than the preceding P-type doping process. As a result, the transistors 312, 313, 316, 317, 413, 414, 417, 418, 512, 513, 516, 517, 613, 614, 617, 618 in the areas 221-228 are converted from P channel transistors into N channel transistors.

In one embodiment, dielectric spacers (not shown) are formed on side walls of the gate electrode lines 211-214. Illustratively, the dielectric spacers are formed by (i) CVD a dielectric layer (e.g., nitride layer) on top of the interfacing area 142, then (ii) RIE the deposited dielectric layer (not shown) to form the dielectric spacers on side walls of the gate electrode lines 211-214. Next, in one embodiment, a nickel layer (not shown) is formed by sputtering or evaporation of nickel everywhere on top of the interfacing area 142. Next, in one embodiment, the interfacing area 142 is annealed such that nickel chemically reacts with exposed silicon, resulting in nickel silicide regions (not shown) on top of the gate electrode lines 211-214 and the portions of the fin regions not covered by the spacers. Next, in one embodiment, unreacted nickel is removed by wet etch.

Next, in one embodiment, the contact regions 241 and 242 are formed on top of the interfacing area 142. Illustratively, the contact region 241 and 242 comprise an electrically conducting material, such as tungsten, poly plug, or Cu, etc. In one embodiment, the contact regions 241 and 242 are formed by a conventional method.

In an alternative embodiment of the fabrication process of the structure 100 of FIG. 1, a silicon substrate (not shown) is patterned to form STI (shallow trench isolation) trenches (not shown) in the silicon substrate resulting silicon fin regions (not shown) similar to the fin regions 111-118. Next, in one embodiment, the trenches are filled with silicon dioxide. Next, in one embodiment, the structure is polished so that the top surface of the structure becomes planar. Next, in one embodiment, in the interfacing areas 142 and 144, gate electrode lines (not shown) similar to the gate electrode lines 211-214 of FIG. 3 are formed in a direction perpendicular to the fin regions. At each intersection of the fin regions and the gate electrode lines, a transistor (not shown) can be formed. It should be noted that these so-formed transistors are planar devices. A planar device is a device in which the common interfacing surface between its channel region and its gate dielectric layer is parallel to the top surface of a wafer on which the planar device is formed.

It should be noted that a non-planar device is a device in which the common interfacing surface between its channel region and its gate dielectric layer is not parallel to the top surface of a wafer on which the non-planar device is formed. As a result, if formed according to the method of FIGS. 3A-3E, then the resulting transistor 311-318, 411-418, 511-518, and 611-618 (FIG. 2) are non-planar devices.

It should be noted that the present invention can be applied to the cases in which the memory cell array areas 141 and 143 contain memory elements such as Phase Change Memory (PCM), Perovskite, Solid Electrolyte, Spin-torque Magnetic Random Access Memory (MRAM), binary oxide resistive RAM (RRAM), etc, in addition to rectifying elements (e.g., pn junction diodes).

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A semiconductor structure, comprising:
   (a) a substrate;
   (b) $2^N$ semiconductor regions on the substrate,
   wherein N is a positive integer, and
   wherein the $2^N$ semiconductor regions are parallel to one another and run in a first direction;
   (c) first N gate electrode lines on the $2^N$ semiconductor regions, such that an intersection transistor exists at each of intersections between the first N gate electrode lines and the $2^N$ semiconductor regions,
   wherein the first N gate electrode lines run in a second direction which is perpendicular to the first direction, and
   wherein the first N gate electrode lines are electrically insulated from the $2^N$ semiconductor regions;
   (d) a contact region electrically coupled to the $2^N$ semiconductor regions; and
   (e) a first plurality of memory cells on the $2^N$ semiconductor regions,
   wherein the first N gate electrode lines are disposed between the first plurality of memory cells and the contact region,
   wherein in response to pre-specified voltage potentials being applied to the contact region and the first N gate electrode lines, memory cells of the first plurality of memory cells on only one of the $2^N$ semiconductor regions are selected, and wherein intersection transistors on each semiconductor region of the $2^N$ semiconductor regions form a unique combination in terms of channel types.

2. The semiconductor structure of claim 1, wherein each of the first plurality of memory cells is selected from the group consisting of Phase Change Memory (PCM), Perovskite, Solid Electrolyte, binary oxide resistive RAM (RRAM), and Spin-torque Magnetic Random Access Memory (MRAM) memory cells.

3. The semiconductor structure of claim 1, wherein a first pitch of the $2^N$ semiconductor regions is less than a second pitch of the first N gate electrode lines.

4. The semiconductor structure of claim 1, wherein N is two.

5. The semiconductor structure of claim 4,
wherein a first intersection transistor, a second intersection transistor, a third intersection transistor, and a fourth intersection transistor are disposed at intersections of a first gate electrode line of the first N gate electrode lines and a first semiconductor region, a second semiconductor region, a third semiconductor region, and a fourth semiconductor region of the $2^N$ semiconductor regions, respectively,
wherein a fifth intersection transistor, a sixth intersection transistor, a seventh intersection transistor, and an eighth intersection transistor are disposed at intersections of a second gate electrode line of the first N gate electrode lines and the first semiconductor region, the second semiconductor region, the third semiconductor region, and the fourth semiconductor region of the $2^N$ semiconductor regions, respectively, and
wherein one half of the first, second, third, fourth, fifth, sixth, seventh, and eighth intersection transistors are P channel transistors and the other half are N channel transistors.

6. The semiconductor structure of claim 5, wherein the intersection transistors are non-planar devices.

7. The semiconductor structure of claim 5, wherein the intersection transistors are planar devices.

8. The semiconductor structure of claim 5, wherein the first and fifth, second and sixth, third and seventh, fourth and eighth intersection transistors are P-P, N-P, N-N, P-N channel transistors, respectively.

9. The semiconductor structure of claim 5, wherein the first, second, third, and fourth semiconductor regions are disposed next to each other in that order.

10. The semiconductor structure of claim 1, further comprising:
(i) second N gate electrode lines on the $2^N$ semiconductor regions, such that an intersection transistor exists at each of intersections between the second N gate electrode lines and the $2^N$ semiconductor regions,
wherein the second N gate electrode lines run in the second direction, and
wherein the second N gate electrode lines are electrically insulated from the $2^N$ semiconductor regions;
(ii) a second plurality of memory cells disposed on the $2^N$ semiconductor regions,
wherein the second N gate electrode lines are disposed between the second plurality of memory cells and the contact region,
wherein in response to pre-specified voltage potentials being applied to the contact region and the second N gate electrode lines, memory cells of the second plurality of memory cells disposed on only one of the $2^N$ semiconductor regions are selected, and wherein intersection transistors on each semiconductor region of the $2^N$ semiconductor regions form a unique combination in terms of channel types.

11. The semiconductor structure of claim 10, wherein N is two.

12. A device operation method, comprising:
providing a semiconductor structure which includes:
(a) a substrate;
(b) $2^N$ semiconductor regions on the substrate, wherein N is a positive integer, and wherein the $2^N$ semiconductor regions are parallel to one another and run in a first direction;
(c) first N gate electrode lines on the $2^N$ semiconductor regions, such that an intersection transistor exists at each of intersections between the first N gate electrode lines and the $2^N$ semiconductor regions,
wherein the first N gate electrode lines run in a second direction which is perpendicular to the first direction, and
wherein the first N gate electrode lines are electrically insulated from the $2^N$ semiconductor regions;
(d) a contact region electrically coupled to the $2^N$ semiconductor regions; and
(e) a first plurality of memory cells on the $2^N$ semiconductor regions,
wherein the first N gate electrode lines are disposed between the first plurality of memory cells and the contact region,
wherein in response to pre-specified voltage potentials being applied to the contact region and the first N gate electrode lines, memory cells of the first plurality of memory cells on only one of the $2^N$ semiconductor regions are selected, and
wherein intersection transistors on each semiconductor region of the $2^N$ semiconductor regions form a unique combination in terms of channel types; and
selecting only one of the $2^N$ semiconductor regions by applying pre-specified voltages to the contact region and the first N gate electrode lines.

13. The device operation method of claim 12, wherein the substrate comprises a dielectric material.

14. The device operation method of claim 12, wherein the $2^N$ semiconductor regions comprise silicon.

15. The device operation method of claim 12, wherein the first N gate electrode lines comprise at least one of polysilicon and a metal.

16. The device operation method of claim 12, wherein the contact region comprises a metal.

17. The device operation method of claim 12, wherein a first pitch of the $2^N$ semiconductor regions is less than a second pitch of the first N gate electrode lines.

18. The device operation method of claim 12, wherein N is two.

19. The device operation method of claim 18,
wherein a first intersection transistor, a second intersection transistor, a third intersection transistor, and a fourth intersection transistor are disposed at intersections of a first gate electrode line of the first N gate electrode lines and a first semiconductor region, a second semiconductor region, a third semiconductor region, and a fourth semiconductor region of the $2^N$ semiconductor regions, respectively,
wherein a fifth intersection transistor, a sixth intersection transistor, a seventh intersection transistor, and an eighth intersection transistor are disposed at intersections of a second gate electrode line of the first N gate electrode lines and the first semiconductor region, the second semiconductor region, the third semiconductor region, and the fourth semiconductor region of the $2^N$ semiconductor regions, respectively, and wherein one half of the first, second, third, fourth, fifth, sixth, seventh, and eighth intersection transistors are P channel transistors and the other half are N channel transistors.

20. The device operation method of claim 19, wherein the first and fifth, second and sixth, third and seventh, fourth and eighth intersection transistors are P-P, N-P, N-N, P-N channel transistors, respectively.

21. The device operation method of claim 12, wherein the semiconductor structure further includes:
(i) second N gate electrode lines on the $2^N$ semiconductor regions, such that an intersection transistor exists at each of intersections between the second N gate electrode lines and the $2^N$ semiconductor regions,
wherein the second N gate electrode lines run in the second direction, and
wherein the second N gate electrode lines are electrically insulated from the $2^N$ semiconductor regions;
(ii) a second plurality of memory cells disposed on the $2^N$ semiconductor regions,
wherein the second N gate electrode lines are disposed between the second plurality of memory cells and the contact region, and
wherein in response to pre-specified voltage potentials being applied to the contact region and the second N gate electrode lines, memory cells of the second plurality of memory cells disposed on only one of the $2^N$ semiconductor regions are selected.

22. The device operation method of claim 21, wherein N is two.

23. The device operation method of claim 12, wherein said selecting comprises turning on N intersection transistors at the intersections of the selected semiconductor region and the first N gate electrode lines.

24. A semiconductor fabrication method, comprising:
providing a semiconductor structure which includes a substrate;
forming $2^N$ semiconductor regions on the substrate, wherein N is a positive integer, and
wherein the $2^N$ semiconductor regions are parallel to one another and run in a first direction;
forming first N gate electrode lines on the $2^N$ semiconductor regions, such that an intersection transistor exists at each of intersections between the first N gate electrode lines and the $2^N$ semiconductor regions,
wherein the first N gate electrode lines run in a second direction which is perpendicular to the first direction, and
wherein the first N gate electrode lines are electrically insulated from the $2^N$ semiconductor regions;
forming a contact region electrically coupled to the $2^N$ semiconductor regions; and
forming a first plurality of memory cells disposed on the $2^N$ semiconductor regions,
wherein the first N gate electrode lines are disposed between the first plurality of memory cells and the contact region,
wherein in response to pre-specified voltage potentials being applied to the contact region and the first N gate electrode lines, memory cells of the first plurality of memory cells disposed on only one of the $2^N$ semiconductor regions are selected, and
wherein intersection transistors on each semiconductor region of the $2^N$ semiconductor regions form a unique combination in term of P channel transistor and N channel transistor.

25. The semiconductor fabrication method of claim 24, wherein a first pitch of the $2^N$ semiconductor regions is less than a second pitch of the first N gate electrode lines.

26. The semiconductor fabrication method of claim 24, wherein N is two.

27. The semiconductor fabrication method of claim 26,
wherein a first intersection transistor, a second intersection transistor, a third intersection transistor, and a fourth intersection transistor are disposed at intersections of a first gate electrode line of the first N gate electrode lines and a first semiconductor region, a second semiconductor region, a third semiconductor region, and a fourth semiconductor region of the $2^N$ semiconductor regions, respectively,
wherein a fifth intersection transistor, a sixth intersection transistor, a seventh intersection transistor, and an eighth intersection transistor are disposed at intersections of a second gate electrode line of the first N gate electrode lines and the first semiconductor region, the second semiconductor region, the third semiconductor region, and the fourth semiconductor region of the $2^N$ semiconductor regions, respectively, and
wherein one half of the first, second, third, fourth, fifth, sixth, seventh, and eighth intersection transistors are P channel transistors and the other half are N channel transistors.

28. The semiconductor fabrication method of claim 27, wherein the first and fifth, second and sixth, third and seventh, fourth and eighth intersection transistors are P-P, N-P, N-N, P-N channel transistors, respectively.

29. The semiconductor fabrication method of claim 24, further comprising:
(i) forming second N gate electrode lines on the $2^N$ semiconductor regions, such that an intersection transistor exists at each of intersections between the second N gate electrode lines and the $2^N$ semiconductor regions,
wherein the second N gate electrode lines run in the second direction, and wherein the second N gate electrode lines are electrically insulated from the $2^N$ semiconductor regions; and
(ii) forming a second plurality of memory cells disposed on the $2^N$ semiconductor regions,
wherein the second N gate electrode lines are disposed between the second plurality of memory cells and the contact region, and
wherein in response to pre-specified voltage potentials being applied to the contact region and the second N gate electrode lines, memory cells of the second plurality of memory cells disposed on only one of the $2^N$ semiconductor regions are selected.

30. The semiconductor fabrication method of claim 29, wherein N is two.

31. The semiconductor fabrication method of claim 24,
wherein said forming $2^N$ semiconductor regions involves sub-lithography, and
wherein said forming the first N gate electrode lines involves standard lithography.

32. A semiconductor structure, comprising:
(a) a substrate;
(b) $2^N$ semiconductor regions on the substrate, N being an integer greater than 1;
(c) $2^M$ semiconductor regions on the substrate, M being an integer greater than 1;

wherein the $2^N$ semiconductor regions and the $2^M$ semiconductor regions run in a first direction, wherein all the $2^N$ semiconductor regions and the $2^M$ semiconductor regions run through a memory cell array area of the substrate, wherein the $2^N$ semiconductor regions but not the $2^M$ semiconductor regions run through a first interfacing area of the substrate which abuts the memory cell array area, wherein the $2^M$ semiconductor regions but not the $2^N$ semiconductor regions run through a second interfacing area of the substrate which abuts the memory cell array area, wherein the memory cell array area is disposed between the first and second interfacing areas, and wherein in the memory cell array area, for any two consecutive semiconductor regions of the $2^N$ semiconductor regions, there is a semiconductor region of the $2^M$ semiconductor regions sandwiched between the two consecutive semiconductor regions; and (d) N gate electrode lines on the $2^N$ semiconductor regions and in the first interfacing area, such that an intersection transistor exists at each of intersections between the N gate electrode lines and the $2^N$ semiconductor regions in the first interfacing area, wherein the N gate electrode lines run in a second direction which is perpendicular to the first direction, wherein the N gate electrode lines are electrically insulated from the $2^N$ semiconductor regions, and wherein intersection transistors on each semiconductor region of the $2^N$ semiconductor regions form a unique combination in terms of channel type.

33. A semiconductor structure of claim 32, further comprising M gate electrode lines on the $2^M$ semiconductor regions and in the second interfacing area, such that an intersection transistor exists at each of intersections between the M gate electrode lines and the $2^M$ semiconductor regions in the second interfacing area, wherein the M gate electrode lines run in the second direction, wherein the M gate electrode lines are electrically insulated from the $2^M$ semiconductor regions, and wherein intersection transistors on each semiconductor region of the $2^M$ semiconductor regions form a unique combination in terms of channel type.

34. The semiconductor structure of claim 32, wherein a first pitch of the $2^N$ semiconductor regions in the first interfacing area is greater than a second pitch of the $2^N$ and $2^M$ semiconductor regions in the memory cell array area.

35. The semiconductor structure of claim 34, wherein the first pitch is about twice the second pitch.

36. The semiconductor structure of claim 34, wherein a third pitch of the $2^M$ semiconductor regions in the second interfacing area is greater than the second pitch of the $2^N$ and $2^M$ semiconductor regions in the memory cell array area.

* * * * *